(12) United States Patent
Park et al.

(10) Patent No.: US 9,693,455 B1
(45) Date of Patent: Jun. 27, 2017

(54) INTEGRATED CIRCUIT PACKAGING SYSTEM WITH PLATED COPPER POSTS AND METHOD OF MANUFACTURE THEREOF

(71) Applicants: Seong Won Park, Icheon-si (KR); Hun Teak Lee, Seongnam-si (KR); WoonJae Beak, Cheongju-si (KR); MinJung Kim, Kwang-ju (KR); ChangHwan Kim, Cheonan-si (KR); ByungHyun Kwak, Icheon-si (KR); GwangTae Kim, Seoul (KR); HeeSoo Lee, Anyang-si (KR)

(72) Inventors: Seong Won Park, Icheon-si (KR); Hun Teak Lee, Seongnam-si (KR); WoonJae Beak, Cheongju-si (KR); MinJung Kim, Kwang-ju (KR); ChangHwan Kim, Cheonan-si (KR); ByungHyun Kwak, Icheon-si (KR); GwangTae Kim, Seoul (KR); HeeSoo Lee, Anyang-si (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/227,346

(22) Filed: Mar. 27, 2014

(51) Int. Cl.
| | |
|---|---|
| H05K 1/11 | (2006.01) |
| H05K 3/36 | (2006.01) |
| H05K 3/40 | (2006.01) |
| H05K 1/09 | (2006.01) |
| H05K 1/18 | (2006.01) |
| H05K 1/14 | (2006.01) |
| H05K 3/32 | (2006.01) |
| H05K 3/46 | (2006.01) |

(52) U.S. Cl.
CPC ............... *H05K 1/112* (2013.01); *H05K 1/09* (2013.01); *H05K 1/113* (2013.01); *H05K 3/36* (2013.01); *H05K 3/4038* (2013.01); *H05K 1/14* (2013.01); *H05K 1/18* (2013.01); *H05K 3/32* (2013.01); *H05K 3/46* (2013.01); *H05K 2201/04* (2013.01)

(58) Field of Classification Search
CPC .......... H05K 1/112; H05K 1/09; H05K 3/038; H05K 1/113; H05K 1/14; H05K 1/145; H05K 1/18; H05K 1/182; H05K 1/185; H05K 2201/04
USPC ................. 174/250–268; 361/760, 792–795; 257/686
See application file for complete search history.

(56) References Cited

U.S. PATENT DOCUMENTS

| | | | |
|---|---|---|---|
| 6,418,615 B1 * | 7/2002 | Rokugawa | H01L 23/49811 257/E23.062 |
| 7,582,556 B2 * | 9/2009 | Lin | H01L 21/76801 438/626 |
| 7,923,304 B2 | 4/2011 | Choi et al. | |

(Continued)

*Primary Examiner* — Ishwarbhai B Patel
(74) *Attorney, Agent, or Firm* — Wong & Rees LLP

(57) ABSTRACT

A system and method of manufacture of an integrated circuit packaging system includes: a copper film; a first metal layer directly on the copper film; an insulation layer directly on and over the first metal layer, the insulation layer having a via hole through the insulation layer; a conductive via within the via hole and directly on the first metal layer; a second metal layer directly on the conductive via and the insulation layer; a copper post directly on the copper film; a solder pad over the copper post; and an interposer coupled to the copper post and the solder pad.

20 Claims, 9 Drawing Sheets

(56) References Cited

U.S. PATENT DOCUMENTS

| | | |
|---|---|---|
| 8,004,074 B2 | 8/2011 | Mori et al. |
| 8,039,303 B2 * | 10/2011 | Shim .................... H01L 21/568 257/100 |
| 8,106,495 B2 | 1/2012 | Kajiki |
| 8,207,450 B2 | 6/2012 | An et al. |
| 8,273,603 B2 | 9/2012 | Racz et al. |
| 8,378,383 B2 * | 2/2013 | Pagaila ................ H01L 21/568 257/125 |
| 8,458,900 B2 * | 6/2013 | Kodani ............... H01L 21/4853 29/832 |
| 8,502,370 B2 | 8/2013 | Chan et al. |
| 8,581,401 B2 * | 11/2013 | Lu ......................... C25D 5/022 257/734 |
| 8,623,755 B2 | 1/2014 | Liu et al. |
| 8,674,516 B2 | 3/2014 | Han et al. |
| 9,287,245 B2 * | 3/2016 | Wu ......................... H01L 23/31 |
| 2002/0121692 A1 * | 9/2002 | Lee ......................... H01L 24/05 257/737 |
| 2005/0184377 A1 * | 8/2005 | Takeuchi ............ H01L 21/6835 257/686 |
| 2007/0164457 A1 * | 7/2007 | Yamaguchi ......... H01L 23/5389 257/787 |
| 2013/0319738 A1 * | 12/2013 | Hurwitz ............ H01L 23/49827 174/257 |

* cited by examiner

INTEGRATED CIRCUIT PACKAGING SYSTEM WITH PLATED COPPER POSTS AND METHOD OF MANUFACTURE THEREOF

TECHNICAL FIELD

The present invention relates generally to an integrated circuit packaging system, and more particularly to a system with plated copper posts.

BACKGROUND ART

Modem electronics, such as smart phones, tablet computers, location based services devices, enterprise class servers, or enterprise class storage arrays, are packing more integrated circuits into an ever-shrinking physical space with expectations for decreasing cost. Numerous technologies have been developed to meet these requirements. Research and development strategies focus on new technologies as well as on improving the existing and mature technologies. Research and development in the existing technologies can take a myriad of different directions.

Modern electronics requirements demand increased functionality in an integrated circuit package while providing less physical space in the system. While these approaches provide more functions within an integrated circuit, they do not fully address the requirements for lower height, smaller space, simplified manufacturing, and cost reduction.

One way to reduce cost is to use mature package technologies with existing manufacturing methods and equipment. The reuse of existing manufacturing processes does not typically result in the reduction of package dimensions. The demand still continues for lower cost, smaller size, improved connectivity, and more functionality.

Thus, a need still remains for an integrated circuit packaging system including lower cost, smaller size, and more functionality. In view of the ever-increasing need to improve integration and cost reduction, it is increasingly critical that answers be found to these problems. Ever-increasing commercial competitive pressures, along with growing consumer expectations, make it critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a first metal layer directly on a copper film of a carrier; forming an insulation layer directly on and over the first metal layer; forming a via hole through the insulation layer for exposing the first metal layer; forming a conductive via and a second metal layer on the insulation layer, the conductive via within the via hole and directly on the first metal layer; removing the carrier for exposing the copper film; forming a post mask having a post mask opening for exposing the copper film; forming a copper post directly on the copper film and within the post mask opening; and attaching an interposer on the copper post with a solder pad.

The present invention provides an integrated circuit packaging system including: a copper film; a first metal layer directly on the copper film; an insulation layer directly on and over the first metal layer, the insulation layer having a via hole through the insulation layer; a conductive via within the via hole and directly on the first metal layer; a second metal layer directly on the conductive via and the insulation layer; a copper post directly on the copper film; a solder pad over the copper post; and an interposer coupled to the copper post and the solder pad.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
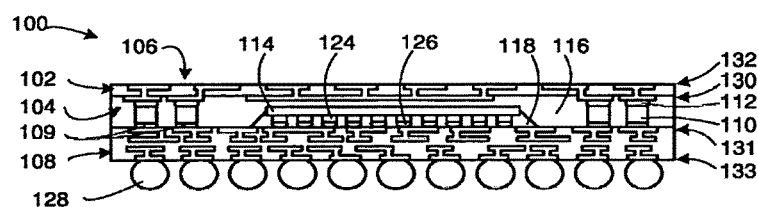
FIG. 1 is a side view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

The term "processing" as used herein includes deposition of material or photoresist, patterning, exposure, development, etching, ablating, grinding, buffing, cleaning, and/or removal of the material or photoresist as required in forming a described structure. The term "active side" means the side of an element having exposed electrical components or electrical interconnections for attaching to external elements.

For expository purposes, the term "horizontal" as used herein is defined as a plane parallel to the active side of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

Referring now to FIG. 1, therein is shown a side view of an integrated circuit packaging system 100 in a first embodiment of the present invention. The integrated circuit packaging system 100 can include an interposer 102 mounted over a substrate 108 with an integrated circuit 114 mounted on the substrate 108.

The interposer 102 is a structural element for redistributing electrical signals. For example the interposer 102 can be a redistribution layer, a carrier, a circuit board, an adapter, or a combination thereof.

The substrate 108 is a structural element for redistributing electrical signals from an active device. For example, the substrate 108 can be a redistribution layer, a chip carrier, a circuit board, or a combination thereof.

The interposer 102 can be mounted over the substrate 108. The interposer 102 and the substrate 108 can be electrically connected with a copper film 109 and copper posts 110 between the interposer and the substrate 108. The copper posts 110 are electrically conductive structural elements. The copper posts 110 are for transferring electrical signals vertically between two elements. The copper posts 110 are sized to extend between two elements. Although the copper posts 110 are described as being made of copper, it is understood that other conductive materials such as gold, other metals, metal alloys, or a combination thereof can be used for forming the copper posts 110.

The integrated circuit packaging system 100 can include the interposer 102 having a first metal layer 130 on an interposer inner side 104. The first metal layer 130 is a conductive layer for transferring electrical signals. For example, the first metal layer 130 can be a redistribution layer, a trace layer, or a combination thereof.

The integrated circuit packaging system 100 can include a second metal layer 132 on an interposer outer side 106. The second metal layer 132 can be electrically coupled to first metal layer 130. The second metal layer 132 is a conductive layer for transferring electrical signals. For example, the second metal layer 132 can be a redistribution layer, a trace layer, or a combination thereof.

The integrated circuit packaging system 100 can include the copper posts 110 formed on the first metal layer 130 or the second metal layer 132. The copper posts 110 can include solder interconnects 112 on the side of the copper posts 110 facing away from the first metal layer 130. The solder interconnects 112 are electrical structures for attaching the copper posts 110 to other elements.

The integrated circuit packaging system 100 can include the integrated circuit 114 mounted to the substrate 108 with die interconnects 124. The integrated circuit 114 is an active electrical component for processing electronic signals. The die interconnects 124 are conductive structures for transferring electrical signals from the integrated circuit 114 to other elements.

The integrated circuit 114 can be mounted to the substrate 108 with interconnect pads 126. The interconnect pads 126 is an electrical element for attaching interconnects. For example the interconnect pads 126 can include a solder ball, a solder bump, a solder post, or a combination thereof.

The integrated circuit 114 can be electrically coupled to the substrate 108 with the die interconnects 124 and the interconnect pads 126. The interconnect pads 126 can be electrically coupled to the metal layers of the substrate 108.

The integrated circuit packaging system 100 can include an underfill layer 118 formed directly on the integrated circuit 114, the die interconnects 124, the interconnect pads 126, and a portion of the substrate 108. The underfill layer 118 is an insulating protective layer. The underfill layer 118 can be formed from a resin, polymer, paste, or a combination thereof. The underfill layer 118 can be formed between the integrated circuit 114 and the substrate 108. The underfill layer 118 can be directly on a portion of the sides and bottom of the integrated circuit 114.

The integrated circuit packaging system 100 can include an encapsulation 116 between the interposer 102 and the substrate 108. The encapsulation 116 is an electrically insulating material for providing electrical and environmental protection. The encapsulation 116 can be formed from an encapsulation material such as a resin, polymer, epoxy, paste, or a combination thereof. The encapsulation 116 can be formed directly on the interposer 102, the copper posts 110, the solder interconnects 112, the substrate 108, the integrated circuit 114, and the underfill layer 118.

The encapsulation 116 can be between the interposer 102 and the substrate 108. The encapsulation 116 can be exposed from between the interposer 102 and the substrate 108. The encapsulation 116 can have an exposed side coplanar with the exposed sides of the interposer 102 and the substrate 108.

The integrated circuit packaging system 100 can include external interconnects 128 for connecting to external systems (not shown). The external interconnects 128 can include solder balls, solder bumps, solder posts, leads, wires, or a combination thereof. The external interconnects 1281 can form an electrical connection to the integrated circuit 114 through the substrate 108.

It has been discovered that forming the copper posts 110 directly on the metals layers of the interposer 102 and mounting the interposer 102 on the substrate 108 improves manufacturing yield and reduce electric noise. Coupling the interposer 102 and the substrate 108 with the copper posts 110 simplifies the formation of a highly conductive vertical signal path between the interposer 102 and the substrate 108.

It has been discovered that forming the copper posts 110 directly on the metals layers of the substrate 108 and mounting the interposer 102 on the substrate 108 improves manufacturing yield and reduces electric noise. Coupling the interposer 102 and the substrate 108 with the copper posts 110 simplifies the formation of a highly conductive vertical signal path between the interposer 102 and the substrate 108.

It has been discovered the forming the copper posts 110 around and outside a perimeter of the integrated circuit 114 increases reliability and reduces signal noise. Forming the copper posts 110 around the integrated circuit 114 provides electrical shielding to reduce radiated electromagnetic interference from the integrated circuit 114.

It has been discovered that providing the copper posts 110 between the interposer 102 and the substrate 108 can increase reliability and manufacturing yield. The copper posts 110 can act as spacers to prevent the bowing of the outer portions of the interposer 102 and the substrate 108.

It has been discovered that providing the copper posts 110 between the interposer 102 and the substrate 108 can increase reliability and manufacturing yield. The copper posts 110 provide sufficient separation to allow the formation of the encapsulation 116 between the integrated circuit 114 and the interposer 102. The encapsulation 116 electrically insulates the integrated circuit 114 and the interposer 102 and increases the amount of heat dissipation from the integrated circuit 114 by providing a direct heat path from the integrated circuit 114.

It has been discovered that mounting the interposer 102 over the substrate 108 with the copper posts 110 allows a higher number of input output connections on the interposer 102. Increased input output count can increase signal transfer and data throughput.

Figure 2:
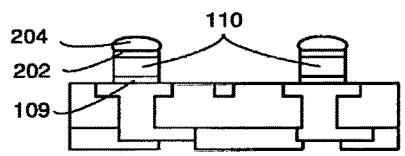
FIG. 2 is a side view of the copper posts.

Referring now to FIG. 2, therein is shown a side view of the copper posts 110. The copper posts 110 can be formed directly on one of the metal layers of the interposer 102 of FIG. 1 or the substrate 108 of FIG. 1.

The copper posts 110 can include a post pad 202 at the end of the copper posts 110 facing away from the metal layers. The post pad 202 is a conductive element. The post pad 202 can provide a conductive surface that can bond to the copper posts 110 and provide a solder wettable surface for attaching to a solder pad 204. The solder pad 204 is a structural conductive element for coupling the copper posts 110 to another element. For example, the solder pad 204 can be a solder ball, a solder bump, a solder post, a solder layer, or a combination thereof.

The post pad 202 can provide a solder wettable surface and act as a diffusion barrier between the copper posts 110 and the solder. The diffusion barrier can inhibit fast diffusion that can lead to electromechanical failure.

The copper posts 110 can have different configurations. For example, the post pad 202 can be omitted and the solder pad 204 can be formed directly on the copper posts 110.

In an illustrative example, the post pad 202 and the solder pad 204 can be combined as a single pad layer. In another example, the post pad 202 can be omitted and the solder pad 204 can be formed directly on the copper posts 110.

Figure 3:
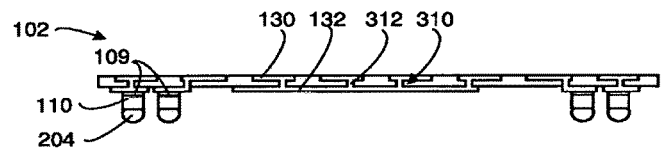
FIG. 3 is an exemplary side view of the interposer.

Referring now to FIG. 3, therein is shown an exemplary side view of the interposer 102. The interposer 102 can include the copper posts 110 directly on one of the metal layers of the interposer 102. Each of the copper posts 110 can include the solder pad 204 on the end of the copper posts 110 facing away from the interposer 102.

The interposer 102 can include the first metal layer 130 and the second metal layer 132 on opposite horizontal sides of the interposer 102. The interposer 102 can include a conductive via 312 in a via hole 310. The conductive via 312 can electrically connecting the first metal layer 130 and the second metal layer 132. The via hole 310 is a vertical opening in the interposer 102 extending from the first metal layer 130 to the second metal layer 132. The conductive via 312 is a conductive element within and completely filling the via hole 310.

Figure 4:
FIG. 4 is an exemplary side view of the substrate.

Referring now to FIG. 4, therein is shown an exemplary side view of the substrate 108. The substrate 108 can include the integrated circuit 114 mounted over the second metal layer 132.

The substrate 108 can include the copper posts 110 directly on one of the metal layers of the substrate 108. Each of the copper posts 110 can include the solder pad 204 on the end of the copper posts 110 facing away from the substrate 108.

The substrate 108 can include the first metal substrate layer 131 and the second metal substrate layer 133 on opposite horizontal sides of the substrate 108. The substrate 108 can include the conductive via 312 in the via hole 310. The conductive via 312 can electrically connecting the first metal substrate layer 131 and the second metal substrate layer 133. The via hole 310 is a vertical opening in the substrate 108 extending from the first metal substrate layer 131 to the second metal substrate layer 133. The conductive via 312 is a conductive element within and completely filling the via hole 310.

Figure 5:
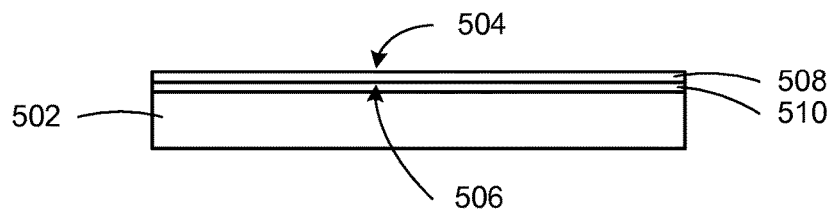
FIG. 5 is the structure of FIG. 1 in a provisioning phase of manufacturing.

Referring now to FIG. 5, therein is shown the structure of FIG. 1 in a provisioning phase of manufacturing. The provisioning phase can include a provisioning method to provide a carrier 502.

The provisioning phase can include providing the carrier 502. The carrier 502 is a structural element. For example, the carrier 502 can be a fiberglass layer, a polymer layer, a circuit board, a metal layer, or a combination thereof.

The carrier 502 can include a copper film 508, such as the copper film 109, attached to the carrier 502. The copper film 508 can include a film top side 504 and a film bottom side 506. The film top side 504 faces away from the carrier 502. The film bottom side 506 faces the carrier 502.

The copper film 508 can be directly on a detachable layer 510. The detachable layer 510 is a structural element for attaching the copper film 508 to the carrier 502. The detachable layer 510 is between the copper film 508 and the carrier 502. The film bottom side 506 is directly on the detachable layer 510.

The detachable layer 510 can be formed from a variety of materials. For example, the detachable layer 510 can be an adhesive, bonding layer, ultraviolet (UV) light sensitive film, or a combination thereof.

The detachable layer 510 can be treated to lose adhesion and allow the separation of the copper film 508 from the carrier 502. For example, the detachable layer 510 can be activated with UV light, heat, solvents, or a combination thereof.

Although the components of the carrier assembly are described individually, it is understood that the carrier assembly can be provided as a pre-formed component. For example, the carrier assembly can be a copper clad substrate provided by SEMCO, Kinsus, or other companies.

The carrier assembly can have various configurations. For example, the carrier 502 can be a FR4 layer (Fire Resistant level 4), stainless steel, a copper/steel laminate, a fiberglass layer, other laminates, or a combination thereof.

In an illustrative example, the carrier 502 can be a FR4 layer having an 18 μm copper film formed directly on a 2 μm seed copper layer on both sides of the carrier 502. In another example, the carrier 502 can be a stainless steel layer with a 3 μm seed copper layer, a 3 μm nickel layer, and 10 μm copper layer on both sides of the carrier 502.

Figure 6:
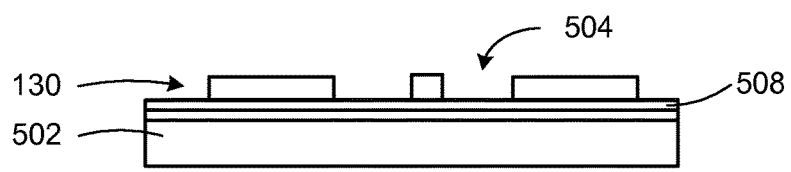
FIG. 6 is the structure of FIG. 5 in a first patterning phase of manufacturing.

Referring now to FIG. 6, therein is shown the structure of FIG. 5 in a first patterning phase of manufacturing. The first patterning phase can include a first patterning method for forming the first metal layer 130. The first metal layer 130 can be formed on the film top side 504 of FIG. 5.

The first metal layer 130 can be formed by plating the film top side 504 of the copper film 508 with a first conductive layer (not shown), applying a first pattern mask (not shown) over the first conductive layer, and etching the first conductive layer and the pattern mask to form the first metal layer 130. The copper film 508 is between the first metal layer 130 and the carrier 502. The copper film 508 can be exposed on the portions of the copper film 508 not covered by the first metal layer 130.

Figure 7:
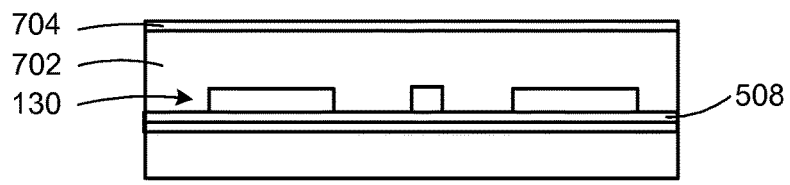
FIG. 7 is the structure of FIG. 6 in a first metal embedding phase of manufacturing.

Referring now to FIG. 7, therein is shown the structure of FIG. 6 in a first metal embedding phase of manufacturing. The first metal embedding phase can include a first metal embedding method for covering the first metal layer 130.

The first metal layer 130 can have an insulation layer 702 formed directly on and over the first metal layer 130. The insulation layer 702 can be directly on the copper film 508. The insulation layer 702 can be a pre-impregnated (prepreg) material formed from materials such as resin, epoxy, polymers, or a combination thereof. The insulation layer 702 can include a conductive film 704 directly on the insulation layer 702 on the side facing away from the first metal layer 130. The conductive film 704 can be copper, other metals, alloys, or a combination thereof. The conductive film 704 can be provided with the prepreg material or laminated directly on the insulation layer 702 in a prepreg lamination process.

Figure 8A:
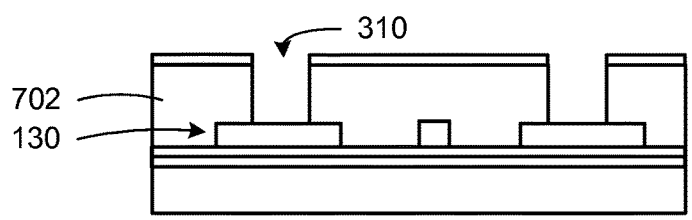
FIG. 8A is the structure of FIG. 7 in a via hole forming phase of manufacturing.

Referring now to FIG. 8A, therein is shown the structure of FIG. 7 in a via hole forming phase of manufacturing. The via hole forming phase can form the via hole 310 in the insulation layer 702 to expose a portion of the first metal layer 130. The via hole 310 can be formed by drilling, laser drilling, etching, or a combination thereof. Although the via hole 310 is shown with vertical sidewalls, it is understood that the via hole 310 can have angled side walls characteristic of laser drilling or etching.

Figure 8B:
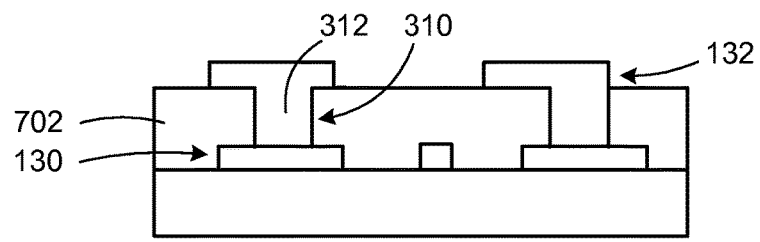
FIG. 8B is the structure of FIG. 8A in a second patterning phase of manufacturing.

Referring now to FIG. 8B, therein is shown the structure of FIG. 8A in a second patterning phase of manufacturing. The second patterning phase can include a second patterning method for forming the conductive via 312 and the second metal layer 132

The conductive via 312 and a second metal layer 132 can be formed at the same time by positioning a pattern mask (not shown) over the insulation layer 70 and depositing a conductive material over the insulation layer 702 and the pattern mask. The pattern mask, such as a dry film layer, can define the location of the second metal layer 132. The conductive material can be depositing within the via hole 310 to form the conductive via 312 in direct contact with the first metal layer 130. The conductive material can be copper, other metals, alloys, or a combination thereof.

The second metal layer 132 can be formed directly on and over the conductive via 312 and the insulation layer 702. The second metal layer 132 can form an electrical connection with the conductive via 312. The pattern mask, such as the dry film layer, can be removed after forming the second metal layer 132 and the conductive via 312.

Figure 9:
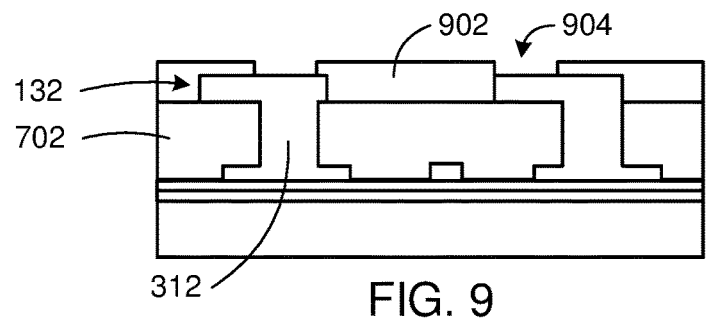
FIG. 9 is the structure of FIG. 8B in a solder resist phase of manufacturing.

Referring now to FIG. 9, therein is shown the structure of FIG. 8 in a solder resist phase of manufacturing. The solder resist phase can include a depositing method for forming a solder resist layer 902 over the second metal layer 132 and the insulation layer 702.

The solder resist layer 902 can be formed directly on and over the second metal layer 132 and the insulation layer 702. The solder resist layer 902 is a protective layer. For example, the solder resist layer 902 can be formed from a polymer, epoxy, resin, or a combination thereof.

The solder resist layer 902 can be etched to form solder resist openings 904. The solder resist openings 904 are holes in the solder resist layer 902 for exposing portions of the second metal layer 132.

Figure 10:
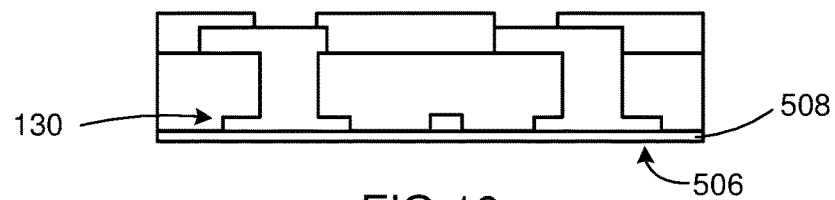
FIG. 10 is the structure of FIG. 9 in a carrier removing phase of manufacturing.

Referring now to FIG. 10, therein is shown the structure of FIG. 9 in a carrier removing phase of manufacturing. The removing phase can include a removal method for removing the carrier 502 of FIG. 5.

For example, the carrier 502 can be removed by separating the detachable layer 510 of FIG. 5. The detachable layer 510 can be separated by applying UV light, heat, solvents, etching, cutting, grinding, or a combination thereof. In another example, the carrier 502 and the detachable layer 510 can be removed by chemical etching, mechanical peeling, laser etching, grinding, cutting, or a combination thereof.

Removing the carrier 502 and the detachable layer 510 can expose the film bottom side 506 of the copper film 508. The copper film 508 is directly on the first metal layer 130.

Figure 11:
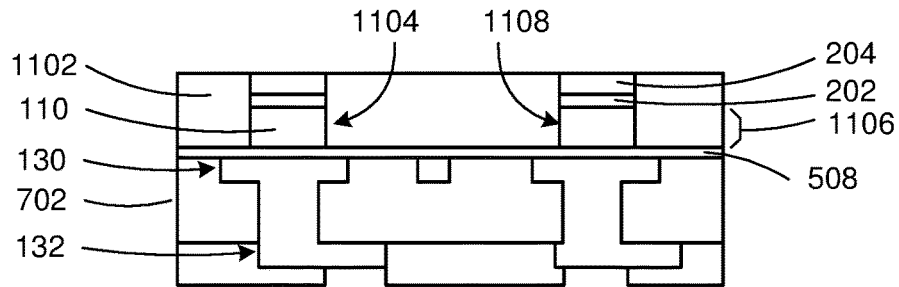
FIG. 11 is the structure of FIG. 10 in a plating phase of manufacturing.

Referring now to FIG. 11, therein is shown the structure of FIG. 10 in a plating phase of manufacturing. The plating phase can include a plating method for forming the copper posts 110.

The plating phase can include inverting the insulation layer 702 having the first metal layer 130 and the second metal layer 132. The copper film 508 is directly on the insulation layer 702 and the first metal layer 130. The plating phase can include forming a post mask layer 1102 directly on the copper film 508. The post mask layer 1102 is formed on the side of the copper film 508 facing away from the first metal layer 130 and the insulation layer 702.

The post mask layer 1102 is a protective layer having a pattern representing the location of the copper posts 110. For example, the post mask layer 1102 can be a dielectric film, an epoxy, a polymer, a resin, a solder resist material, an insulating material, or a combination thereof.

The post mask layer 1102 can include post mask openings 1104. The post mask openings 1104 are holes in the post mask layer 1102 for exposing the copper film 508 directly over the location where the copper posts 110 are formed. The exposed portions of the copper film 508 can provide a surface suitable for depositing the copper posts 110.

The post mask openings 1104 can be formed in a variety of ways. For example, the post mask openings 1104 can be chemically etched, laser etched, drilled, or a combination thereof.

The post mask openings 1104 can have the characteristics of being chemically etched, such as etch marks, a matte finish, non-directional marks, etch residue, or a combination thereof. The post mask openings can have the characteristics of being laser etched, such as etch marks, burns, burn residue, etch residue, burn pattern marks, or a combination thereof. The post mask openings 1104 can have the characteristics of being drilled, such as scratch marks, directional marks, burn marks, burrs, drilling residue, or a combination thereof.

A conductive post layer 1106 can be formed over the post mask layer 1102 and within the post mask openings 1104. The conductive post layer 1106 is a metallic layer for forming the copper posts 110. For example, the conductive post layer 1106 can be formed from a post material 1108 such as copper, gold, a metal, a metal alloy, an electrically conductive material, or a combination thereof.

The conductive post layer 1106 can be formed in a variety of ways. For example, the conductive post layer 1106 can be formed by electrochemical plating, sputtering, three-dimensional printing, or a combination thereof.

The conductive post layer 1106 can form the copper posts 110 directly on the copper film 508 and within the post mask openings 1104. The copper posts 110 can be formed by partially filling the post mask openings 1104. The copper posts 110 can be formed by electrochemically plating the post material 1108 on the copper film 508.

It has been discovered that the copper film 508 simplifies manufacturing and reduces the number of components. The copper film 508 eliminates the need to form a separate seed layer to form the copper posts 110. The copper posts 110 are formed directly on the film bottom side 506 of FIG. 5 of the copper film 508 without requiring a seed layer to facilitate the electrochemical plating of the copper posts 110.

It has been discovered the copper film 508 simplifies manufacturing and improves manufacturing yield. The manufacturing process is simplified by forming the first metal layer 130 on one side of the copper film 508 and forming the copper posts 110 on the opposite side of the copper film 508 and forming a metal to metal bond between the copper posts 110 and the first metal layer 130 for improved conductivity. Using the copper film 508 twice for both manufacturing steps simplifies manufacturing and reduces the amount and number of materials needed.

The post pad 202 can be formed directly on the top side of the copper posts 110 and within the post mask openings 1104. The solder pad 204 can be formed over and directly on the top side of the post pad 202 and within the post mask openings 1104.

The copper posts 110, the post pad 202, and the solder pad 204 can be formed completely within the post mask openings 1104. The sides of the copper posts 110, the post pad 202, and the solder pad 204 can have the impressions of the walls of the post mask openings 1104 including having the characteristics of chemical etching, laser etching, or drilling, as described above.

Forming the copper posts 110 by plating the copper film 508 in the post mask openings 1104 can allow the formation of the copper posts 110 having a fine pitch of between 15-20 µm. Forming the copper posts 110 by plating instead of a subtractive process, a modified semi-additive process (MSAP), or a semi-additive process (SAP) can increase component density by reducing the feature size.

Avoiding a semi-additive process can eliminate the need for using a primer coated copper foil or Ajinomoto Build-up Film in the formation of the copper posts 110. This can simplify manufacturing and reduce the amount of materials needed to form the copper posts 110 having a fine pitch.

In another example, the copper posts 110 can have a pitch of less than 0.35 mm based on the minimum pitch of the external interconnects 128 of FIG. 1. In configurations without the external interconnects 128, the copper posts 110 can have a pitch of less than 0.33 mm.

It has been discovered that forming the copper posts 110 by plating the post mask openings 1104 in the post mask layer 1102 with the conductive post layer 1106 increases circuit density and increase operational performance. The post mask openings 1104 and the copper posts 110 are formed with a narrow pitch to achieve high density input and output for the conductive pads.

It has been discovered that forming the copper posts 110 by plating the copper film 508 in the post mask openings 1104 in the post mask layer 1102 increases component density and simplifies manufacturing. Plating the copper posts 110 on the copper film 508 in the post mask openings 1104 allows the formation of the copper posts 110 having a fine pitch of between 15-20 µm without using a semi-additive process (SAP) or requiring primer coated copper foil or Ajinomoto Build-up Film in the formation of the copper posts 110.

It has been discovered that forming the copper posts 110 on the copper film 508 improves packaging density by reducing the package height. The formation of the copper posts 110 on the substrate 108 provides improved control of package size and the separation between the interposer 102 of FIG. 1 and the substrate 108 of FIG. 1.

It has been discovered that forming the copper posts 110 on the interposer 102 improves packaging density by reducing the package height. The formation of the copper posts 110 on the interposer 102 provides improved control of package size and the separation between the interposer 102 and the substrate 108.

Figure 12:
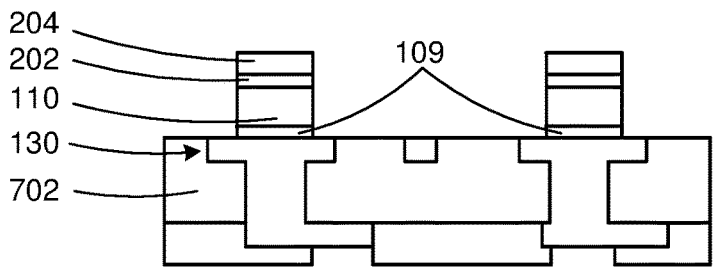
FIG. 12 is the structure of FIG. 11 in an etching phase of manufacturing.

Referring now to FIG. 12, therein is shown the structure of FIG. 11 in an etching phase of manufacturing. The etching phase can include a removal method for removing the post mask layer 1102 of FIG. 11 to expose the copper posts 110.

The post mask layer 1102 can be removed in a variety of ways. For example, the post mask layer 1102 can be removed by chemically etching, laser etching, grinding, drilling, cutting, or a combination thereof. Removing the post mask layer 1102 can expose portions of the first metal layer 130, portions of the insulation layer 702, and the copper posts 110 having the post pad 202 and the solder pad 204. A portion of the copper film 508 that is not directly under the copper posts 110 is removed.

Figure 13:
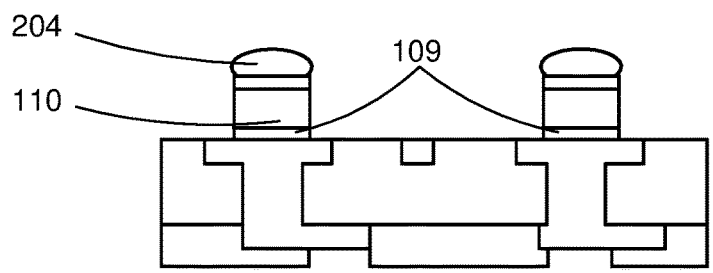
FIG. 13 is the structure of FIG. 12 in a reflow phase of manufacturing.

Referring now to FIG. 13, therein is shown the structure of FIG. 12 in a reflow phase of manufacturing. The reflow phase can include a reflow method for melting the solder pad 204 to attach the copper posts 110 to another element. The reflow phase can include heating the solder pad 204 to a temperature sufficient to melt the solder pad 204 for bonding to another element. For example, the solder pad 204 can bond the copper posts 110 to the interposer 102 of FIG. 1. In another example, the solder pad 204 can bond the copper posts 110 to the substrate 108 of FIG. 1.

Figure 14:
FIG. 14 is the structure of FIG. 1 in a provisioning phase of manufacturing.

Referring now to FIG. 14, therein is shown the structure of FIG. 1 in a provisioning phase of manufacturing. The provisioning phase can include a provisioning method to provide a carrier 1402.

The provisioning phase can include providing the carrier 1402. The carrier 1402 is a structural element. For example, the carrier 1402 can be a fiberglass layer, a polymer layer, a circuit board, a metal layer, or a combination thereof.

The carrier 1402 can include a copper film 1408 attached to the carrier 1402. The copper film 1408 can include a film top side 1404 and a film bottom side 1406. The film top side 1404 faces away from the carrier 1402. The film bottom side 1406 faces the carrier 1402.

The copper film 1408 can be directly on a detachable layer 1410. The detachable layer 1410 is a structural element for attaching the copper film 1408 to the carrier 1402. The detachable layer 1410 is between the copper film 1408 and the carrier 1402. The film bottom side 1406 is directly on the detachable layer 1410.

The detachable layer 1410 can be formed from a variety of materials. For example, the detachable layer 1410 can be an adhesive, bonding layer, ultraviolet (UV) light sensitive film, or a combination thereof.

The detachable layer 1410 can be treated to lose adhesion and allow the separation of the copper film 1408 from the carrier 1402. For example, the detachable layer 1410 can be activated with UV light, heat, solvents, or a combination thereof.

Although the components of the carrier assembly are described individually, it is understood that the carrier assembly can be provided as a pre-formed component. For example, the carrier assembly can be a copper clad substrate provided by SEMCO, Kinsus, or other companies.

The carrier assembly can have various configurations. For example, the carrier 1402 can be a FR4 layer (Fire Resistant level 4), stainless steel, a copper/steel laminate, a fiberglass layer, other laminates, or a combination thereof.

In an illustrative example, the carrier 1402 can be a FR4 layer having an 18 μm copper film formed directly on a 2 μm seed copper layer on both sides of the carrier 1402. In another example, the carrier 1402 can be a stainless steel layer with a 3 μm seed copper layer, a 3 μm nickel layer, and 10 μm copper layer on both sides of the carrier 1402.

The carrier 1402 can include a detachable layer 1410. The detachable layer 1410 can be between the carrier 1402 and the copper film.

Figure 15:
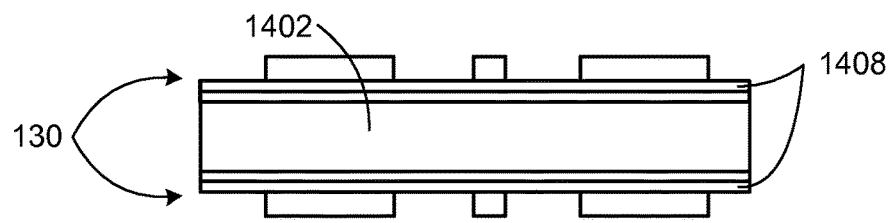
FIG. 15 is the structure of FIG. 14 in a first patterning phase of manufacturing.

Referring now to FIG. 15, therein is shown the structure of FIG. 14 in a first patterning phase of manufacturing. The first patterning phase can include a first patterning method for forming the first metal layer 130. The first metal layer 130 can be formed on the film top side 1404 of FIG. 14 and the film bottom side 1406 of FIG. 14.

The first metal layer 130 can be formed by plating the film top side 1404 and the film bottom side 1406 with a first conductive layer (not shown), applying a first mask (not shown) over the first conductive layer, and etching the first conductive layer and the first mask to form the first metal layer 130. The carrier 1402 can be a dual sided structure with the first metal layer 130 formed on both sides. The copper film 1408 is between the first metal layer 130 and the carrier 1402. The copper film 1408 can be exposed on the portions of the copper film 1408 not covered by the first metal layer 130.

Figure 16:
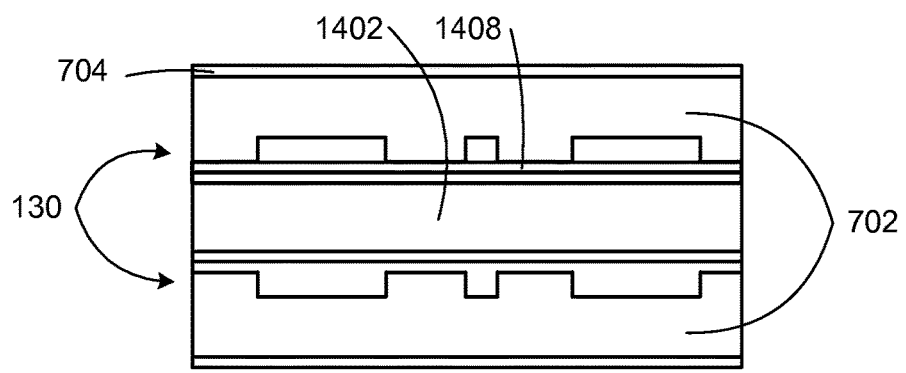
FIG. 16 is the structure of FIG. 15 in a first metal embedding phase of manufacturing.

Referring now to FIG. 16, therein is shown the structure of FIG. 15 in a first metal embedding phase of manufacturing. The first metal embedding phase can include a first metal embedding method for covering the first metal layer 130 on both sides of the carrier 1402.

The first metal layer 130 can have an insulation layer 702 formed directly on the first metal layer 130 on both sides of the carrier 1402. The insulation layer 702 can be directly on the copper film 1408. The insulation layer 702 can be a pre-impregnated (prepreg) material formed from materials such as resin, epoxy, polymers, or a combination thereof. The insulation layer 702 can include a conductive film 704 directly on the insulation layer 702 on the side facing away from the first metal layer 130. The conductive film 704 can be copper, other metals, alloys, or a combination thereof. The conductive film 704 can be provided with the prepreg material or laminated directly on the insulation layer 702 in a prepreg lamination process.

Figure 17A:
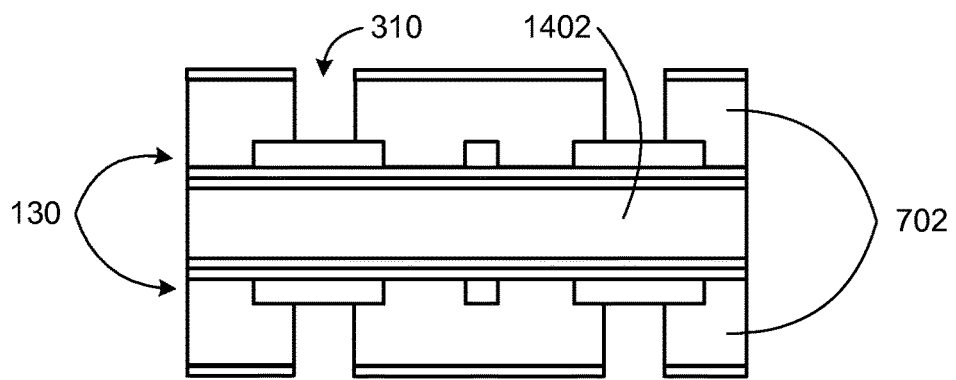
FIG. 17A is the structure of FIG. 16 in a via hole forming phase of manufacturing.

Referring now to FIG. 17A, therein is shown the structure of FIG. 16 in a via hole forming phase of manufacturing. The via hole forming phase can form the via hole 310 in the insulation layer 702 to expose a portion of the first metal layer 130 on both sides of the carrier 1402. The via hole 310 can be formed by drilling, laser drilling, etching, or a combination thereof. Although the via hole 310 is shown with vertical sidewalls, it is understood that the via hole 310 can have angled side walls characteristic of laser drilling or etching.

Figure 17B:
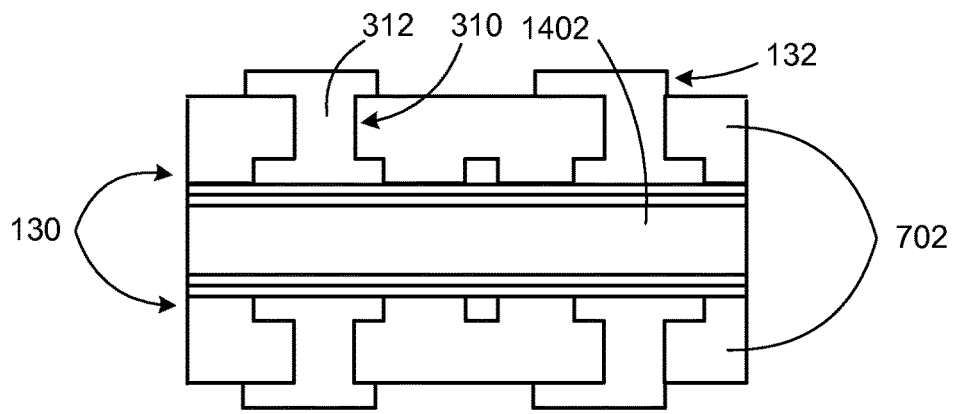
FIG. 17B is the structure of FIG. 17A in a second patterning phase of manufacturing.

Referring now to FIG. 17B, therein is shown the structure of FIG. 17A in a second patterning phase of manufacturing. The second patterning phase can include a second patterning method for forming the conductive via 312 and the second metal layer 132

The conductive via 312 and a second metal layer 132 can be formed at the same time by positioning a pattern mask (not shown) over the insulation layer 70 and depositing a conductive material over the insulation layer 702 and the pattern mask. The pattern mask, such as a dry film layer, can define the location of the second metal layer 132. The conductive material can be depositing within the via hole 310 to form the conductive via 312 in direct contact with the first metal layer 130. The conductive material can be copper, other metals, alloys, or a combination thereof.

The second metal layer 132 can be formed directly on and over the conductive via 312 and the insulation layer 702 on both sides of the carrier 1402. The second metal layer 132 can be form an electrical connection with the conductive via 312. The pattern mask, such as the dry film layer, can be removed after forming the second metal layer 132 and the conductive via 312.

Figure 18:
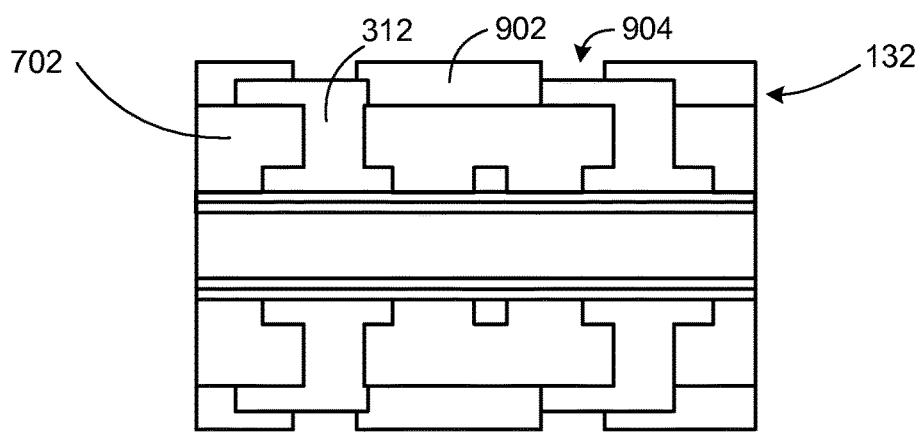
FIG. 18 is the structure of FIG. 17B in a solder resist phase of manufacturing.

Referring now to FIG. 18, therein is shown the structure of FIG. 17B in a solder resist phase of manufacturing. The solder resist phase can include a depositing method for forming a solder resist layer 902 over the second metal layer 132 and the insulation layer 702.

The solder resist layer 902 can be formed directly on and over the second metal layer 132 and the insulation layer 702. The solder resist layer 902 is a protective layer. For example, the solder resist layer 902 can be formed from a polymer, epoxy, resin, or a combination thereof.

The solder resist layer 902 can be etched to form the solder resist openings 904. The solder resist openings 904 are holes in the solder resist layer 902 for exposing portions of the second metal layer 132.

Figure 19:
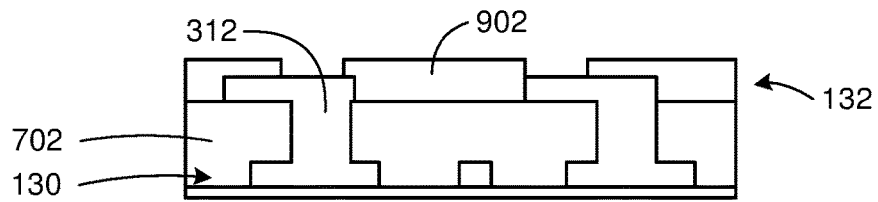
FIG. 19 is the structure of FIG. 18 in a carrier removing phase of manufacturing.

Referring now to FIG. 19, therein is shown the structure of FIG. 18 in a carrier removing phase of manufacturing. The removing phase can include a removal method for removing the carrier 1402 of FIG. 14. The carrier 1402 can be removed to expose the first metal layer 130 and form two individual units each having the insulation layer 702, the first metal layer 130, the second metal layer 132, the solder resist layer 902, and the conductive via 312.

For example, the carrier 1402 can be removed by separating the detachable layer 1410 of FIG. 14. The detachable layer 1410 can be separated by applying UV light, heat, solvents, etching, cutting, grinding, or a combination thereof. In another example, the carrier 1402 and the detachable layer 1410 can be removed by chemical etching, mechanical peeling, laser etching, grinding, cutting, or a combination thereof.

Removing the carrier 1402 and the detachable layer 1410 can expose the film bottom side 1406 of FIG. 14 of the copper film 1408 of FIG. 14. The copper film 1408 is directly on the first metal layer 130.

Figure 20:
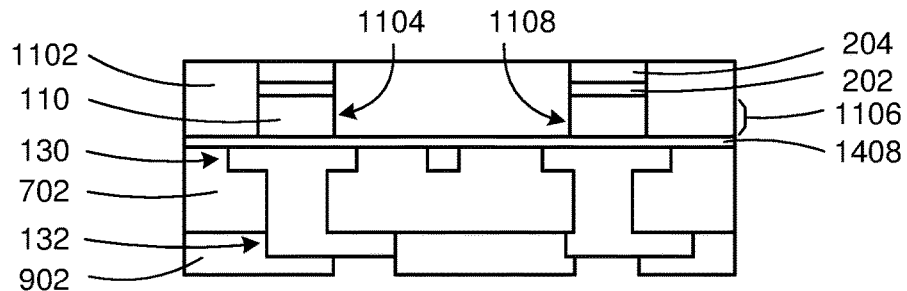
FIG. 20 is the structure of FIG. 19 in a plating phase of manufacturing.

Referring now to FIG. 20, therein is shown the structure of FIG. 19 in a plating phase of manufacturing. The plating phase can include a plating method for forming the copper posts 110.

The plating phase can include inverting one of the units with the insulation layer 702 having the first metal layer 130 and the second metal layer 132. The copper film 1408 is directly on the insulation layer 702 and the first metal layer 130. The plating phase can include forming a post mask layer 1102 directly on the copper film 1408. The post mask layer 1102 is formed on the side of the copper film 1408 facing away from the first metal layer 130 and the insulation layer 702.

The post mask layer 1102 is a protective layer having a pattern representing the location of the copper posts 110. For example, the post mask layer 1102 can be a dielectric film, an epoxy, a polymer, a resin, a solder resist material, an insulating material, or a combination thereof.

The post mask layer 1102 can include post mask openings 1104. The post mask openings 1104 are holes in the post mask layer 1102 for exposing the copper film 1408 directly over the location where the copper posts 110 are formed. The exposed portions of the copper film 1408 can provide a surface suitable for depositing the copper posts 110.

A conductive post layer 1106 can be formed over the post mask layer 1102 and within the post mask openings 1104. The conductive post layer 1106 is a metallic layer for forming the copper posts 110. For example, the conductive post layer 1106 can be copper, gold, a metal, a metal alloy, an electrically conductive material, or a combination thereof.

The conductive post layer 1106 can be formed in a variety of ways. For example, the conductive post layer 1106 can be formed by electrochemical plating, sputtering, three-dimensional printing, or a combination thereof.

The post mask openings 1104 can be formed in a variety of ways. For example, the post mask openings 1104 can be chemically etched, laser etched, drilled, or a combination thereof.

The post mask openings 1104 can have the characteristics of being chemically etched, such as etch marks, a matte finish, non-directional marks, etch residue, or a combination thereof. The post mask openings can have the characteristics of being laser etched, such as etch marks, burns, burn residue, etch residue, burn pattern marks, or a combination thereof. The post mask openings 1104 can have the characteristics of being drilled, such as scratch marks, directional marks, burn marks, burrs, drilling residue, or a combination thereof.

The conductive post layer 1106 can form the copper posts 110 directly on the copper film 1408 and within the post mask openings 1104. The copper posts 110 can be formed by partially filling the post mask openings 1104. The copper posts 110 can be formed by electrochemically plating the post material 1108 on the copper film 1408.

It has been discovered that the copper film 1408 simplifies manufacturing and reduces the number of components. The copper film 1408 eliminates the need to form a separate seed layer to form the copper posts 110. The copper posts 110 are formed directly on the film bottom side 1406 of FIG. 14 of the copper film 1408 without requiring a seed layer to facilitate the electrochemical plating of the copper posts 110.

It has been discovered the copper film 1408 simplifies manufacturing and improves manufacturing yield. The manufacturing process is simplified by forming the first metal layer 130 on one side of the copper film 1408 and forming the copper posts 110 on the opposite side of the copper film 1408 and forming a metal to metal bond between the copper posts 110 and the first metal layer 130 for improved conductivity. Using the copper film 1408 twice for both manufacturing steps simplifies manufacturing and reduces the amount and number of materials needed.

The post pad 202 can be formed directly on the top side of the copper posts 110 and within the post mask openings 1104. The solder pad 204 can be formed over and directly on the top side of the post pad 202 and within the post mask openings 1104.

The copper posts 110, the post pad 202, and the solder pad 204 can be formed completely within the post mask openings 1104. The sides of the copper posts 110, the post pad 202, and the solder pad 204 can have the impressions of the walls of the post mask openings 1104 including having the characteristics of chemical etching, laser etching, or drilling, as described above.

Forming the copper posts 110 by plating the copper film 1408 in the post mask openings 1104 can allow the formation of the copper posts 110 having a fine pitch of between 15-20 µm. Forming the copper posts 110 by plating instead of a subtractive process, a modified semi-additive process (MSAP), or a semi-additive process (SAP) can increase component density by reducing the feature size.

Avoiding a semi-additive process can eliminate the need for using a primer coated copper foil or Ajinomoto Build-up Film in the formation of the copper posts 110. This can simplify manufacturing and reduce the amount of materials needed to form the copper posts 110 having a fine pitch.

In another example, the copper posts 110 can have a pitch of less than 0.35 mm based on the minimum pitch of the external interconnects 128 of FIG. 1. In configurations without the external interconnects 128, the copper posts 110 can have a pitch of less than 0.33 mm.

It has been discovered that forming the copper posts 110 by plating the post mask openings 1104 in the post mask layer 1102 with the conductive post layer 1106 increases circuit density and increase operational performance. The post mask openings 1104 and the copper posts 110 are formed with a narrow pitch to achieve high density input and output for the conductive pads.

It has been discovered that forming the copper posts 110 by plating the copper film 1408 in the post mask openings 1104 in the post mask layer 1102 increases component density and simplifies manufacturing. Plating the copper posts 110 on the copper film 1408 in the post mask openings 1104 allows the formation of the copper posts 110 having a fine pitch of between 15-20 μm without using a semi-additive process (SAP) or requiring primer coated copper foil or Ajinomoto Build-up Film in the formation of the copper posts 110.

It has been discovered that forming the copper posts 110 on the substrate 108 of FIG. 1 improves packaging density by reducing the package height. The formation of the copper posts 110 on the substrate 108 provides improved control of package size and the separation between the interposer 102 of FIG. 1 and the substrate 108.

It has been discovered that forming the copper posts 110 on the interposer 102 improves packaging density by reducing the package height. The formation of the copper posts 110 on the interposer 102 provides improved control of package size and the separation between the interposer 102 and the substrate 108.

Figure 21:
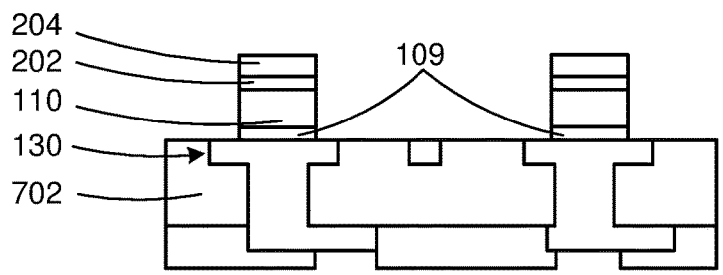
FIG. 21 is the structure of FIG. 20 in an etching phase of manufacturing.

Referring now to FIG. 21, therein is shown the structure of FIG. 20 in an etching phase of manufacturing. The etching phase can include a removal method for removing the post mask layer 1102 of FIG. 11 to expose the copper posts 110.

The post mask layer 1102 can be removed in a variety of ways. For example, the post mask layer 1102 can be removed by chemically etching, laser etching, grinding, drilling, cutting, or a combination thereof. Removing the post mask layer 1102 can expose portions of the first metal layer 130, portions of the insulation layer 702, and the copper posts 110 having the post pad 202 and the solder pad 204.

Figure 22:
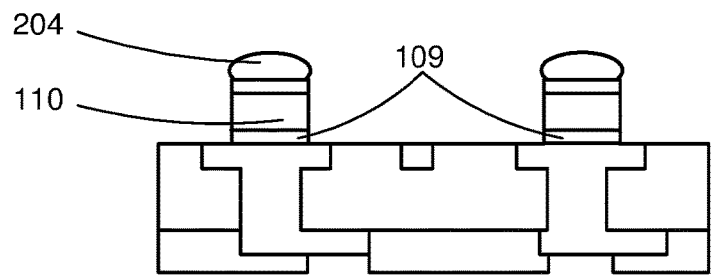
FIG. 22 is the structure of FIG. 21 in a reflow phase of manufacturing.

Referring now to FIG. 22, therein is shown the structure of FIG. 21 in a reflow phase of manufacturing. The reflow phase can include a reflow method for melting the solder pad 204 to attach the copper posts 110 to another element. The reflow phase can include heating the solder pad 204 to a temperature sufficient to melt the solder pad 204 for bonding to another element. For example, the solder pad 204 can bond the copper posts 110 to the interposer 102 of FIG. 1. In another example, the solder pad 204 can bond the copper posts 110 to the substrate 108 of FIG. 1.

Figure 23:
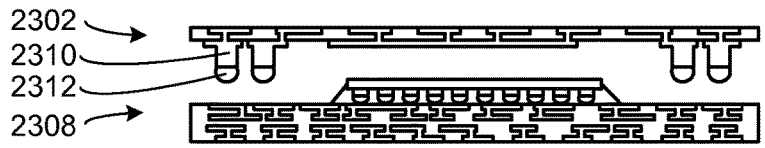
FIG. 23 is a side view of an interposer with copper posts and solder pads.

Referring now to FIG. 23, therein is shown a side view of an interposer 2302 with copper posts 2310 and the solder pads 2312. The interposer 2302 can include the copper posts 2310 formed directly on the interposer 2302. The copper posts 2310 can include the solder pads 2312 on the ends of the copper posts 2310. The interposer 2302 having the copper posts 2310 can be mounted over the substrate 2308 with the solder pads 2312 directly on the substrate 2308.

Figure 24:
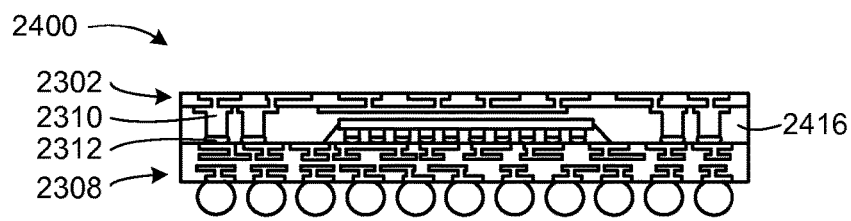
FIG. 24 is a side view of an integrated circuit packaging system in a second embodiment.

Referring now to FIG. 24, therein is shown a side view of an integrated circuit packaging system in a second embodiment. The integrated circuit packaging system 2400 can include the interposer 2302 having the copper posts 2310 tipped with the solder pads 2312 mounted on the substrate 2308. An encapsulation 2416 can be between the interposer 2302 and the substrate 2308.

It has been discovered that forming the copper posts 2310 on the interposer 2302 improves packaging density by reducing the package height. The formation of the copper posts 2310 on the interposer 2302 provides improved control of package size and the separation between the interposer 2302 and the substrate 2308.

Figure 25:
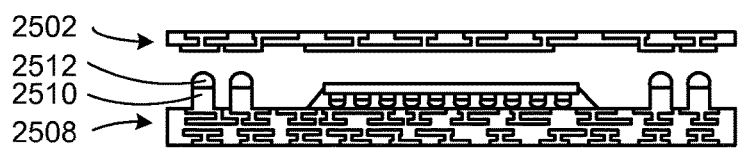
FIG. 25 is a side view of a substrate with copper posts and solder pads.

Referring now to FIG. 25, therein is shown a side view of a substrate with copper posts 2510 and the solder pads 2512. The substrate 2508 can include the copper posts 2510 formed directly on the substrate 2508. The copper posts 2510 can include the solder pads 2512 on the ends of the copper posts 2510. The interposer 2502 can be mounted directly on and over the copper posts 2510 of the substrate 2508.

Figure 26:
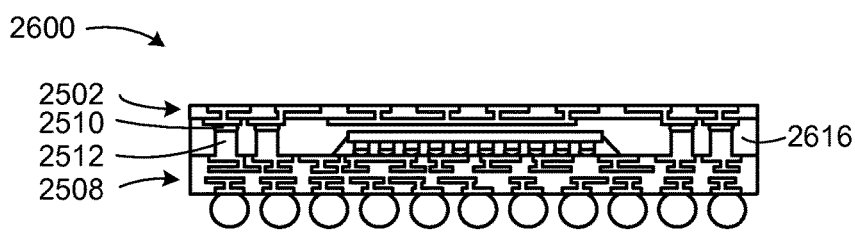
FIG. 26 is a side view of an integrated circuit packaging system in a third embodiment.

Referring now to FIG. 26, therein is shown a side view of an integrated circuit packaging system in a third embodiment. The integrated circuit packaging system 2600 can include the substrate 2508 having the copper posts 2510 tipped with the solder pads 2512. The interposer 2502 can be mounted directly on the solder pads 2512 of the copper posts 2510 of the substrate 2508. An encapsulation 2616 can be between the interposer 2502 and the substrate 2508.

It has been discovered that forming the copper posts 2510 on the substrate 2508 improves packaging density by reducing the package height. The formation of the copper posts 2510 on the substrate 2508 provides improved control of package size and the separation between the interposer 2502 and the substrate 2508.

Figure 27:
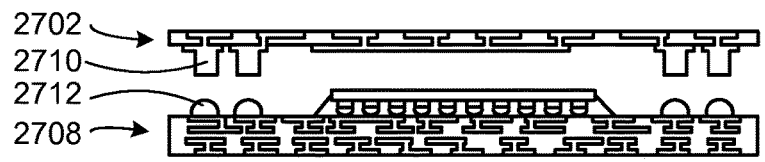
FIG. 27 is a side view of a substrate with solder pads.

Referring now to FIG. 27, therein is shown a side view of a substrate with solder pads. The interposer 2702 can include the copper posts 2710 formed directly on the interposer 2702. The substrate 2708 can include the solder pads 2712 formed directly on the substrate 2708. The substrate 2708 can include solder pads 2712, such as pre-formed solder pads, solder balls, solder posts, or a combination thereof.

Figure 28:
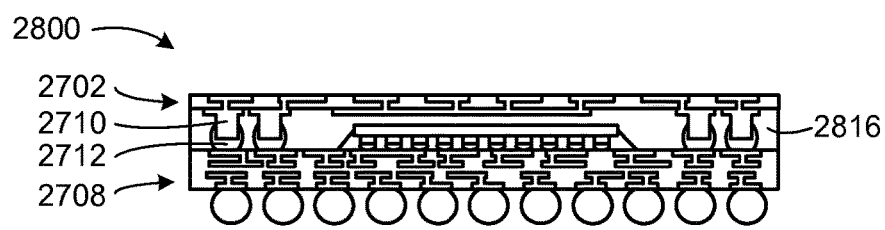
FIG. 28 is a side view of an integrated circuit packaging system in a fourth embodiment.

Referring now to FIG. 28, therein is shown a side view of an integrated circuit packaging system in a fourth embodiment. The integrated circuit packaging system 2800 can include the interposer 2702 having the copper posts 2710 mounted over the substrate 2708 having the solder pads 2712. An encapsulation 2816 can be between the interposer 2702 and the substrate 2708. The solder pads 2712 can be directly on the bottom side and the sides of the copper posts 2710.

It has been discovered that forming the copper posts 2710 on the interposer 2702 improves packaging density by reducing the package height. The formation of the copper posts 2710 on the interposer 2702 provides improved control of package size and the separation between the interposer 2702 and the substrate 2708.

Figure 29:
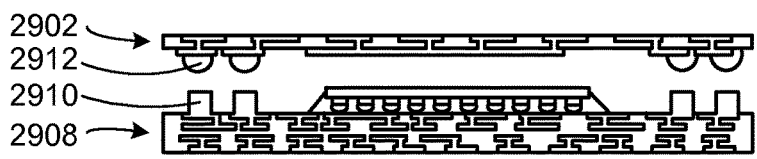
FIG. 29 is a side view of an interposer with solder pads.

Referring now to FIG. 29, therein is shown a side view of an interposer 2902 with the solder pads 2912. The substrate 2908 can include the copper posts 2910 formed directly on the substrate 2908. The interposer 2902 can include the solder pads 2912 formed directly on the interposer 2902. The interposer 2902 can include solder pads 2912, such as pre-formed solder pads, solder balls, solder posts, or a combination thereof.

Figure 30:
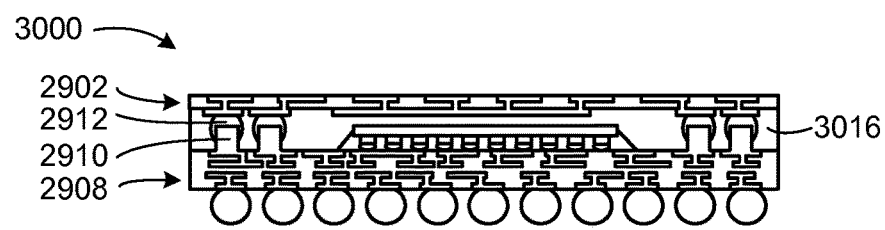
FIG. 30 is a side view of an integrated circuit packaging system in a fifth embodiment.

Referring now to FIG. 30, therein is shown a side view of an integrated circuit packaging system in a fifth embodiment. The integrated circuit packaging system 3000 can include the interposer 2902 having the solder pads 2912 mounted over the substrate 2908 having the copper posts 2910. An encapsulation 3016 can be between the interposer 2902 and the substrate 2908. The copper posts 2910 can be partially encapsulated by the solder pads 2912.

It has been discovered that forming the copper posts 2910 on the substrate 2908 improves packaging density by reducing the package height. The formation of the copper posts 2910 on the substrate 2908 provides improved control of package size and the separation between the interposer 2902 and the substrate 2908.

Figure 31:
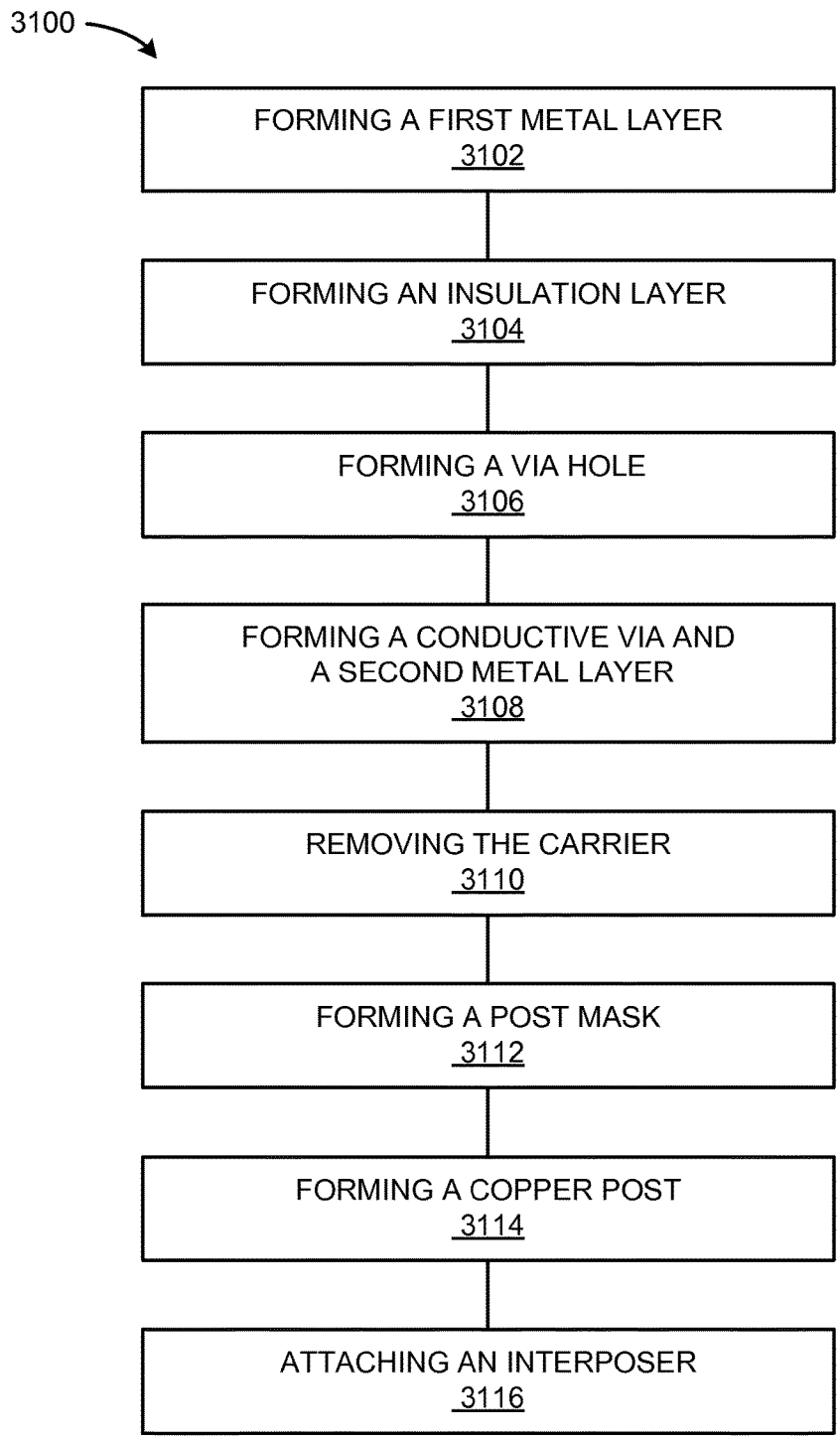
FIG. 31 is a flow chart of a method of manufacture of an integrated circuit packaging system in a further embodiment of the present invention.

Referring now to FIG. 31, therein is shown a flow chart of a method 3100 of manufacture of an integrated circuit packaging system in a further embodiment of the present invention. The method 3100 includes: forming a first metal layer directly on a copper film of a carrier in a block 3102; forming an insulation layer directly on and over the first metal layer in a block 3104; forming a via hole through the insulation layer for exposing the first metal layer in a block 3106; forming a conductive via and a second metal layer on the insulation layer, the conductive via within the via hole and directly on the first metal layer in a block 3108; removing the carrier for exposing the copper film in a block 3110; forming a post mask having a post mask opening for exposing the copper film in a block 3112; forming a copper post directly on the copper film and within the post mask opening in a block 3114; and attaching an interposer on the copper post with a solder pad in a block 3116.

Thus, it has been discovered that the integrated circuit packaging system of the present invention furnishes important and heretofore unknown and unavailable solutions, capabilities, and functional aspects for an integrated circuit packaging system. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying manufacturing, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. A method of manufacture of an integrated circuit packaging system comprising:
    forming a first metal layer directly on a copper film, including a horizontal planar top surface, of a carrier;
    forming an insulation layer directly on and over the first metal layer, the insulation layer having an insulation bottom surface coplanar with a metal layer bottom surface of the first metal layer, the metal layer bottom surface on the horizontal planar top surface;
    forming a via hole through the insulation layer for exposing the first metal layer;
    forming a conductive via and a second metal layer on the insulation layer, the conductive via within the via hole and directly on the first metal layer;
    removing the carrier for exposing the copper film;
    forming a post mask having post mask openings for exposing the copper film;
    forming copper posts having a pitch of between 15-20 micrometers (μm) directly on the side of the copper film opposite the first metal layer and the second metal layer and within the post mask openings; and
    attaching an interposer on the copper posts with solder pads.

2. The method as claimed in claim 1 wherein forming the second metal layer includes:
    forming the first metal layer on a film top side;
    forming the insulation layer with the first metal layer between the carrier and the insulation layer; and
    forming the second metal layer on a side of the insulation layer facing away from the film top side.

3. The method as claimed in claim 1 wherein forming the copper posts includes forming the copper posts on a side of the copper film facing away from the first metal layer.

4. The method as claimed in claim 1 further comprising:
    forming a solder resist layer directly on the second metal layer;
    forming a solder resist opening in the solder resist layer for exposing a portion of the second metal layer; and
    forming an external interconnect in the solder resist opening and directly on the second metal layer.

5. The method as claimed in claim 1 wherein at least one of the copper posts has a width approximately equal to a width of the copper film.

6. A method of manufacture of an integrated circuit packaging system comprising:
    providing a carrier having a copper film including a horizontal planar top surface on a film top side;
    forming a first metal layer directly on the film top side of the copper film;
    forming an insulation layer directly on and over the first metal layer, the insulation layer having an insulation bottom surface coplanar with a metal layer bottom surface of the first metal layer, the metal layer bottom surface on the horizontal planar top surface;
    forming a via hole through the insulation layer for exposing the first metal layer;
    forming a conductive via and a second metal layer on the insulation layer, the conductive via within the via hole and directly on the first metal layer;
    removing the carrier for exposing a film bottom side of the copper film;
    forming a post mask having post mask openings for exposing film bottom side of the copper film;
    forming copper posts having a pitch of between 15-20 micrometers (μm) directly on the film bottom side of the copper film and within the post mask openings;
    forming post pads directly on the copper posts completely within the post mask openings;
    forming solder pads directly on the post pads; and
    attaching an interposer on the copper posts with the solder pads.

7. The method as claimed in claim 6 wherein mounting the interposer includes attaching the copper posts to pre-formed solder pads.

8. The method as claimed in claim 6 wherein forming the solder pad includes forming the solder pad over the copper posts and within the post mask openings.

9. The method as claimed in claim 6 wherein mounting the interposer includes:
    forming the solder pads on a substrate; and
    attaching the interposer having the copper posts to the solder pads.

10. The method as claimed in claim 6 wherein the copper posts are directly on the copper film without a seed layer.

11. An integrated circuit packaging system comprising:
a copper film includes a horizontal planar top surface;
a first metal layer directly on the copper film;
an insulation layer directly on and over the first metal layer, the insulation layer having an insulation bottom surface and a via hole, the insulation bottom surface coplanar with a metal layer bottom surface of the first metal layer, the metal layer bottom surface on the horizontal planar top surface, the via hole through the insulation layer;
a conductive via within the via hole and directly on the first metal layer;
a second metal layer directly on the conductive via and the insulation layer;
copper posts having a pitch of between 15-20 microns (μm) directly on the side of the copper film opposite the first metal layer and the second metal layer;
solder pads over the copper posts; and
an interposer coupled to the copper posts and the solder pads.

12. The system as claimed in claim 11 wherein:
the first metal layer is on the film top side of the copper film and the insulation layer; and
the second metal layer is on a side of the insulation layer facing away from the copper film.

13. The system as claimed in claim 11 wherein the copper posts are on a side of the copper film facing away from the first metal layer.

14. The system as claimed in claim 11 further comprising:
a solder resist layer directly on the second metal layer;
a solder resist opening in the solder resist layer for exposing a portion of the second metal layer; and
an external interconnect in the solder resist opening and directly on the second metal layer.

15. The system as claimed in claim 11 further comprising post pads directly on the copper posts with the solder pads directly on the post pads.

16. The system as claimed in claim 15 wherein the copper posts are attached to the pre-formed solder pads.

17. The system as claimed in claim 15 wherein the solder pad is over the copper post.

18. The system as claimed in claim 15 wherein:
the solder pads are on a substrate; and
the interposer having the copper posts is attached to the solder pads.

19. The system as claimed in claim 15 wherein the copper posts are directly on the copper film without a seed layer.

20. The system as claimed in claim 11 wherein at least one of the copper posts has a width approximately equal to a width of the copper film.

* * * * *